(12) United States Patent
Ozaki

(10) Patent No.: US 9,129,880 B2
(45) Date of Patent: Sep. 8, 2015

(54) IMAGING DEVICE

(71) Applicant: FUJITSU LIMITED, Kawasaki-shi, Kanagawa (JP)

(72) Inventor: Kazuo Ozaki, Zama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/134,886

(22) Filed: Dec. 19, 2013

(65) Prior Publication Data

US 2014/0264705 A1 Sep. 18, 2014

(30) Foreign Application Priority Data

Mar. 18, 2013 (JP) ................. 2013-055025

(51) Int. Cl.
*H01L 27/146* (2006.01)

(52) U.S. Cl.
CPC ................ *H01L 27/14652* (2013.01)

(58) Field of Classification Search
CPC .................................... H01L 27/14652
USPC .................................. 257/440, 226
See application file for complete search history.

(56) References Cited

U.S. PATENT DOCUMENTS

| 6,521,967 | B1 * | 2/2003 | Bandara et al. | 257/440 |
| 6,525,387 | B2 * | 2/2003 | Bauer et al. | 257/440 |
| 2007/0284532 | A1 | 12/2007 | Nakanishi et al. | |
| 2009/0152664 | A1 * | 6/2009 | Klem et al. | 257/440 |
| 2012/0068225 | A1 * | 3/2012 | Gravrand et al. | 257/184 |
| 2012/0104535 | A1 | 5/2012 | Kawakami et al. | |

FOREIGN PATENT DOCUMENTS

| JP | 2007-333464 | 12/2007 |
| JP | 2009-164302 | 7/2009 |
| JP | 2012-94723 | 5/2012 |

OTHER PUBLICATIONS

Sarath D. Gunapala et al., "Demonstration of Megapixel Dual-Band QWIP Focal Plane Array", IEEE Journal of Quantum Electronics, vol. 46, No. 2, Feb. 2010, pp. 285-293.

* cited by examiner

*Primary Examiner* — Peniel M Gumedzoe
*Assistant Examiner* — Christopher Johnson
(74) *Attorney, Agent, or Firm* — Fujitsu Patent Center

(57) ABSTRACT

An imaging device includes: a plurality of first absorption layers that absorb an infrared ray with a given wavelength range, and generate pixel signals of a plurality of pixels, respectively; at least one second absorption layer that absorbs an infrared ray with a wavelength range which is different from the given wavelength range of the first absorption layers, and generates a pixel signal common to the pixels; a plurality of first electrodes that take out the pixel signals from the first absorption layers, respectively; and a second electrode that takes out the pixel signal from the at least one second absorption layer.

6 Claims, 21 Drawing Sheets

US 9,129,880 B2

IMAGING DEVICE

CROSS-REFERENCE TO RELATED APPLICATION

This application is based upon and claims the benefit of priority of the prior Japanese Patent Application No. 2013-055025 filed on Mar. 18, 2013, the entire contents of which are incorporated herein by reference.

FIELD

A certain aspect of the embodiments is related to an imaging device.

BACKGROUND

An infrared imaging device known as an imaging device measures the surface temperature of an object by non-contact in a remote position by incident infrared rays, and is used for detection of the form of the object. The infrared imaging device is used for wide uses, such as a measuring device and a control device in a manufacturing line, a diagnostic device in medical treatment, and a night vision camera and a sensor device, for example.

An infrared imaging device provides an image of the incident infrared rays by use of reflecting mirrors and lenses, and acquires an image by changing the infrared rays into an electric pixel signal. An infrared sensor array includes a plurality of sensor elements arranged in the shape of a two-dimensional matrix, and a readout circuit that reads out pixel data from the sensor elements, for example. The sensor elements and the readout circuit are formed on separate substrates, respectively, and are connected to each other via a conductive bump.

A substrate of the sensor elements is formed of gallium arsenide (GaAs) or the like, for example. On the other hand, a substrate of the readout circuit is formed of silicon (Si) or the like. These substrates are different from each other in material and linear thermal expansion coefficients are different from each other. Therefore, when the substrates are joined by flip chip bonding and the bump formed of a solder is heated for example, there is a problem that stress is applied to each substrate.

Therefore, there is used a method for joining the substrates by forming the bump with flexible metal such as indium (In), pressurizing it under the environment of normal temperature, and pressing one substrate against another substrate.

With respect to the infrared imaging device, for example, Patent Document (see Japanese Laid-open Patent Publication No. 2009-164302) and non-Patent Document (see "Demonstration of Megapixel Dual-Band QWIP Focal Plane Array", IEEE JOURNAL OF QUANTUM ELECTRONICS, (United States of America), 2010 February, VOL. 46, NO. 2, p. 285) describe a double-wavelength QWIP (Quantum Well Infrared Photodetector) which has a sensitivity to the infrared rays with two wavelength ranges. The double-wavelength QWIP is provided with two Multi Quantum Well (MQW) layers which absorb the infrared rays with two wavelength ranges, respectively.

SUMMARY

According to an aspect of the present invention, there is provided an imaging device, including: a plurality of first absorption layers that absorb an infrared ray with a given wavelength range, and generate pixel signals of a plurality of pixels, respectively; at least one second absorption layer that absorbs an infrared ray with a wavelength range which is different from the given wavelength range of the first absorption layers, and generates a pixel signal common to the pixels; a plurality of first electrodes that take out the pixel signals from the first absorption layers, respectively; and a second electrode that takes out the pixel signal from the at least one second absorption layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

As described previously, when the flip chip bonding is performed by the above-mentioned method, if arrangement of a substrate has an error, the bump which is an electrode shifts in a direction along a board face of the substrate, and the bump of a connection target contacts another bump (i.e., a bump to be unconnected) adjacent to the bump. Since arrangement accuracy has a limit, it is inescapable that the error arises in arrangement of the substrate. Therefore, by extending an interval between bumps in each substrate, it is desirable to avoid the contact between the bumps which cause a problem.

Figure 1:
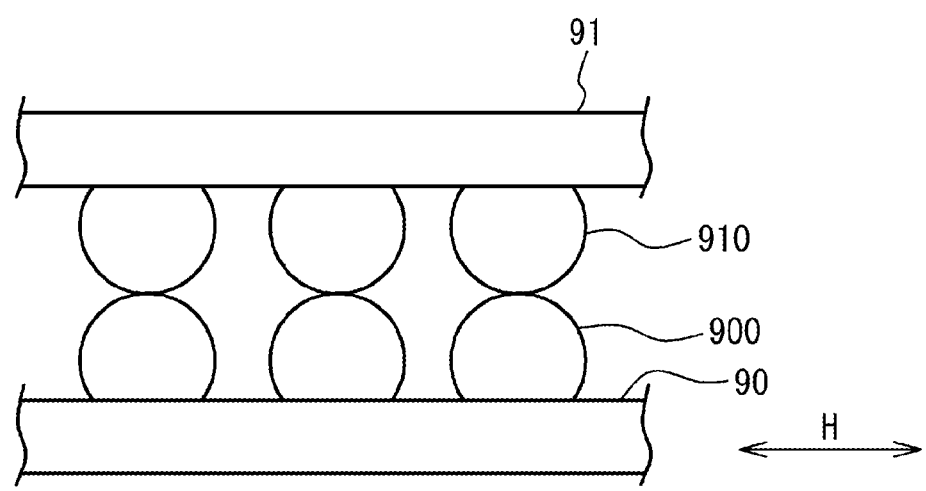
FIG. 1 is a side view of two aligned substrates.

For example, the above-mentioned non-Patent Document discloses a configuration in which three bumps are provided per one pixel, and a configuration in which two bumps are provided per one pixel (see FIG. 1 of non-Patent Document). In the configuration of the former, two multi-quantum well layers and three contact layers are laminated by turns, and three bumps are connected to the three contact layers through metal wirings, respectively. In the configuration of the latter, a common electrode layer is provided instead of the bump connected to a middle contact layer for applying a bias voltage among the three contacts layer, and hence the number of the bumps is reduced. In the configuration of the latter, only one bump is reduced, compared with the configuration of the former. Therefore, the interval between the bumps can be expanded.

Figure 2:
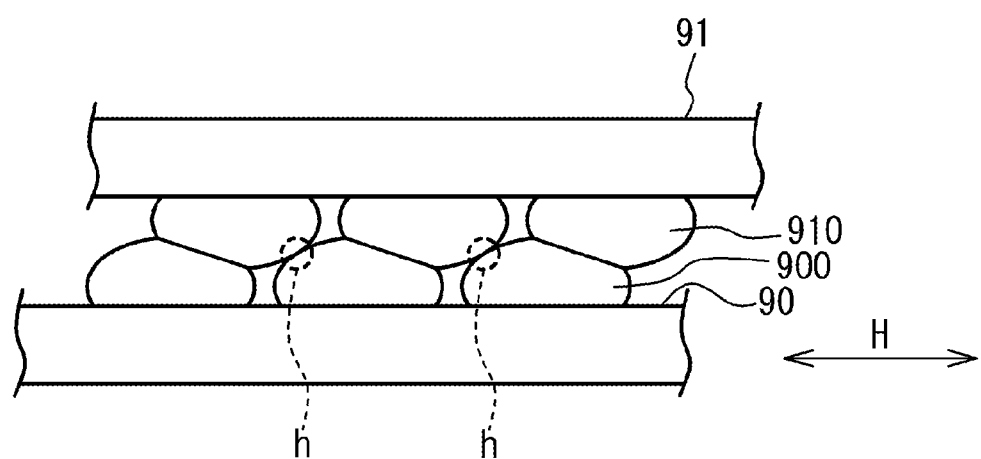
FIG. 2 is a side view of two substrates in which flip chip bonding is performed.

The above-mentioned Patent Document discloses a configuration in which one bump is provided per one pixel (see FIG. 2 of Patent Document). In this configuration, two multi-quantum well layers and three contact layers are laminated by turns, a bias voltage is applied to a top contact layer and a bottom contact layer from the exterior, and a voltage of each wavelength range is detected from a bump connected to a middle contact layer. According to this configuration, the number of bumps is minimum, and hence the interval between the bumps can be expanded, compared with the configuration disclosed in the non-Patent Document.

However, since in the configuration disclosed by the Patent Document, the bump which is a sensing electrode is shared between the two multi-quantum well layers, a signal current of each multi-quantum well layer needs to be detected by turns by time division (see paragraph "0022" of the Patent Document). Therefore, the configuration disclosed by the Patent Documents has a problem that a sufficient detection period is not obtained and hence sensitivity decreases, compared with other configuration.

First, a description will be given of positional deviation of the bump (i.e., an electrode) which arises in flip chip bonding. FIG. 1 is a side view of two aligned substrates 90 and 91.

One of the two substrates 90 and 91 is a sensor substrate on which an infrared detection element is formed, for example. Another one of the two substrates 90 and 91 is a readout circuit substrate that reads out pixel data from the sensor substrate. The sensor substrate is formed of gallium arsenide, for example, and includes a plurality of infrared detection elements. The readout circuit substrate includes a signal processing circuit that processes pixel data of the infrared detection elements as pixel signals, and the readout circuit substrate is formed of silicon or the like.

A plurality of bumps 900 and 910 are provided with the two substrates 90 and 91, respectively. The bumps 900 and 910 on the substrates 90 and 91 are formed of flexible metal such as indium. Although the two substrates 90 and 91 are arranged in an aligned state, the two substrates 90 and 91 have an error in direction H along a plate surface by a limit of the arrangement accuracy.

FIG. 2 is a side view of the two substrates 90 and 91 in which flip chip bonding is performed. Due to the above-mentioned error, the two substrates 90 and 91 are misaligned in the direction H. Therefore, as illustrated by a code "h", the bumps 900 and 910 contact not only the bumps 910 and 900 of connection targets but also another bumps 910 and 900 (i.e., bumps 910 and 900 which are not connection targets) adjacent to the bumps 910 and 900 of connection targets, respectively.

Figure 3:
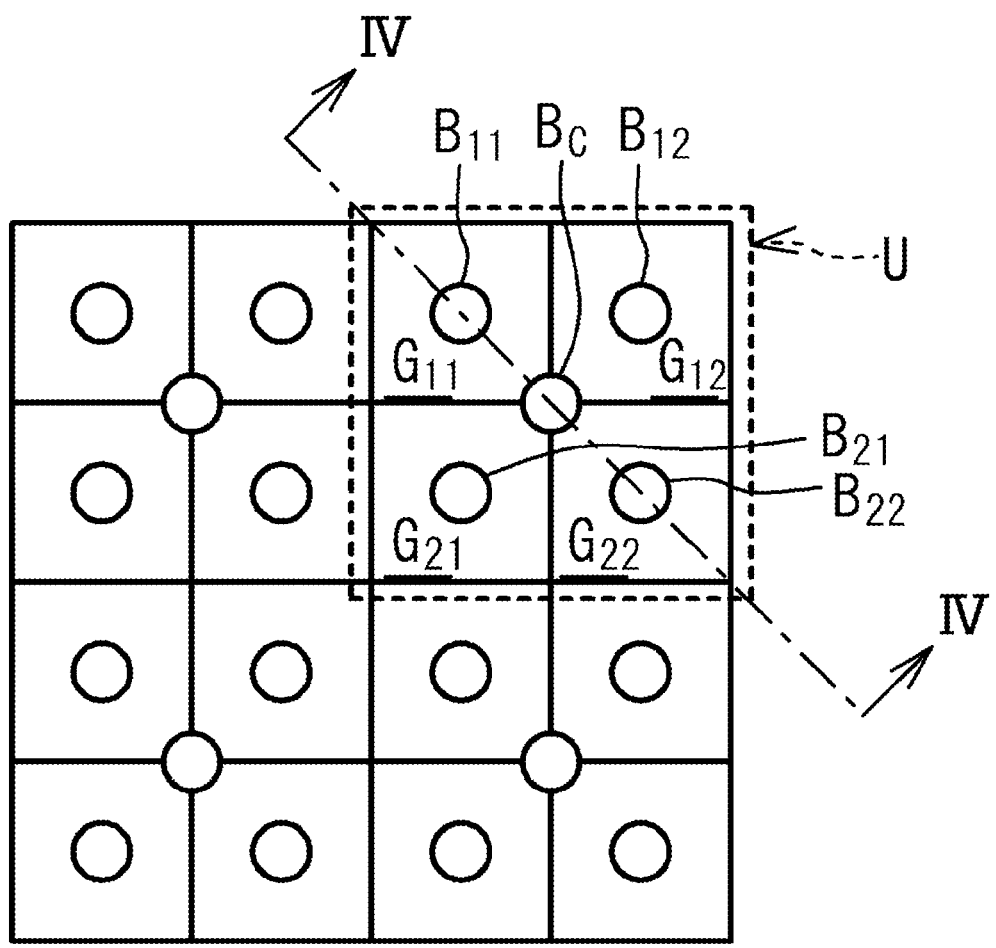
FIG. 3 is a plane view illustrating arrangement of bumps of an imaging device according to an embodiment.

Therefore, an imaging device according to the embodiment has a configuration which can extend an interval between the bumps. FIG. 3 is a plane view illustrating arrangement of the bumps of the imaging device according to the embodiment. More specifically, FIG. 3 illustrates arrangement of the bumps on a plate surface of the sensor substrate. Here, in the present embodiment, an infrared imaging element of the sensor substrate is a double-wavelength QWIP (Quantum Well Infrared Photodetector).

The imaging device has a plurality of pixels arranged in an array as the infrared imaging element. The plurality of pixels has a shape of a square, and are divided into a plurality of sets U. Each of the sets U includes four adjacent pixels $G_{11}$, $G_{12}$, $G_{21}$, and $G_{22}$ arranged by two lines×two rows. That is, a plurality of sets of pixels are arranged in the plane of the imaging device. In the following description, one of the plurality of sets U is explained, but the explained contents are common to each set U.

Individual bumps (i.e., first electrodes) $B_{11}$, $B_{12}$, $B_{21}$, and $B_{22}$ are provided near the centers of the pixels $G_{11}$, $G_{12}$, $G_{21}$, and $G_{22}$ included in the set U (hereinafter referred to as "pixel set U"), respectively. The individual bumps $B_{11}$, $B_{12}$, $B_{21}$, and $B_{22}$ takes out pixel signals of the four pixels $G_{11}$, $G_{12}$, $G_{21}$, and $G_{22}$, respectively.

Moreover, a common bump $B_C$ (i.e., a second electrode) which takes out a common pixel signal between the four pixels $G_{11}$, $G_{12}$, $G_{21}$, and $G_{22}$ is provided in the center of the pixel set U. The plurality of individual bumps $B_{11}$, $B_{12}$, $B_{21}$, and $B_{22}$ are arranged at equal intervals around the common bump $B_C$ so as to have optimal arrangement intervals as described later. Each of the bumps $B_C$, $B_{11}$, $B_{12}$, $B_{21}$, and $B_{22}$ has a circular shape in a top view, and is formed of flexible metal such as indium.

Figure 4:
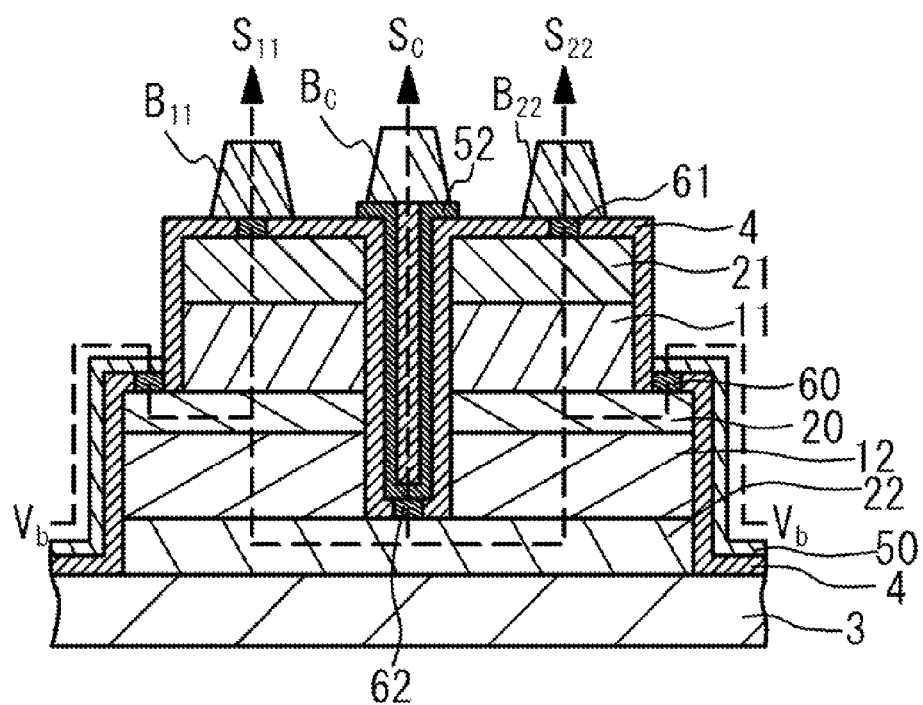
FIG. 4 is a cross-section view illustrating a cross-section surface taken along a IV-IV line of FIG. 3.

FIG. 4 is a cross-section view illustrating a cross-section surface taken along a IV-IV line of FIG. 3. The imaging device includes an insulating substrate 3, a plurality of upper contact layers 21, a middle contact layer 20, a lower contact layer 22, a plurality of upper absorption layers (i.e., first absorption layers) 11, and a lower absorption layer (i.e., a second absorption layer) 12. The imaging device further includes a surface wiring 50, a leading wiring 52, an insulating film 4, metal films 60 to 62, the individual bumps $B_{11}$, $B_{12}$, $B_{21}$, and $B_{22}$, and the common bump $B_C$.

The insulating substrate 3 is formed of gallium arsenide which has insulation properties. The lower contact layer 22, the lower absorption layer 12, the middle contact layer 20, the upper absorption layers 11, and the upper contact layers 21 are laminated on the insulating substrate 3 in this order. The insulating substrate 3 supports the layers 11, 12, and 20 to 22.

The contact layers 20 to 22 are formed of an n-type GaAs semiconductor, and has conductivity. The lower absorption layer 12 is sandwiched between the lower contact layer 22 and the middle contact layer 20. Each of the upper absorption layers 11 is sandwiched between the middle contact layer 20 and each of the upper contact layers 21. Therefore, the contact layers 20 to 22 function as electrodes of the upper absorption layers 11 and the lower absorption layer 12.

The upper absorption layers 11 and the lower absorption layer 12 are multi-quantum well (MQW) layers, and absorb the infrared rays of mutually different wavelength ranges. At the time of incidence of the infrared ray, electrons are excited from an excitation level to a base level by light absorption in the quantum wells of the upper absorption layers 11 and the lower absorption layer 12. Then, when a bias voltage Vb is applied to the middle contact layer 20, the electrons are taken out from the quantum wells to the exterior, and a photoelectric current which is the pixel signal occurs. Each of the upper absorption layers 11 and the lower absorption layer 12 is not limited to a layer having such quantum well structure, and may be structure using a quantum dot, bulk material, or a semiconductor layer composed of a superlattice layer.

The insulating film 4 is a passivation film, such as a silicon dioxide film, and, cover a laminated body in whole. The surface wiring 50 is formed along an isolation groove between pixels, extends in a lamination direction on a side surface of the laminated body, and is connected to the middle contact layer 20 via the metal film 60. When the middle contact layer 20 takes out the pixel signals from the upper absorption layers 11 and the lower absorption layer 12, the bias voltage Vb is applied from the exterior via the surface wiring 50.

The individual bumps $B_{11}$ and $B_{22}$ are connected to the upper contact layers 21 via metal films 61, respectively. This is the same as the individual bumps $B_{12}$ and $B_{21}$ which are not illustrated.

Figure 5:
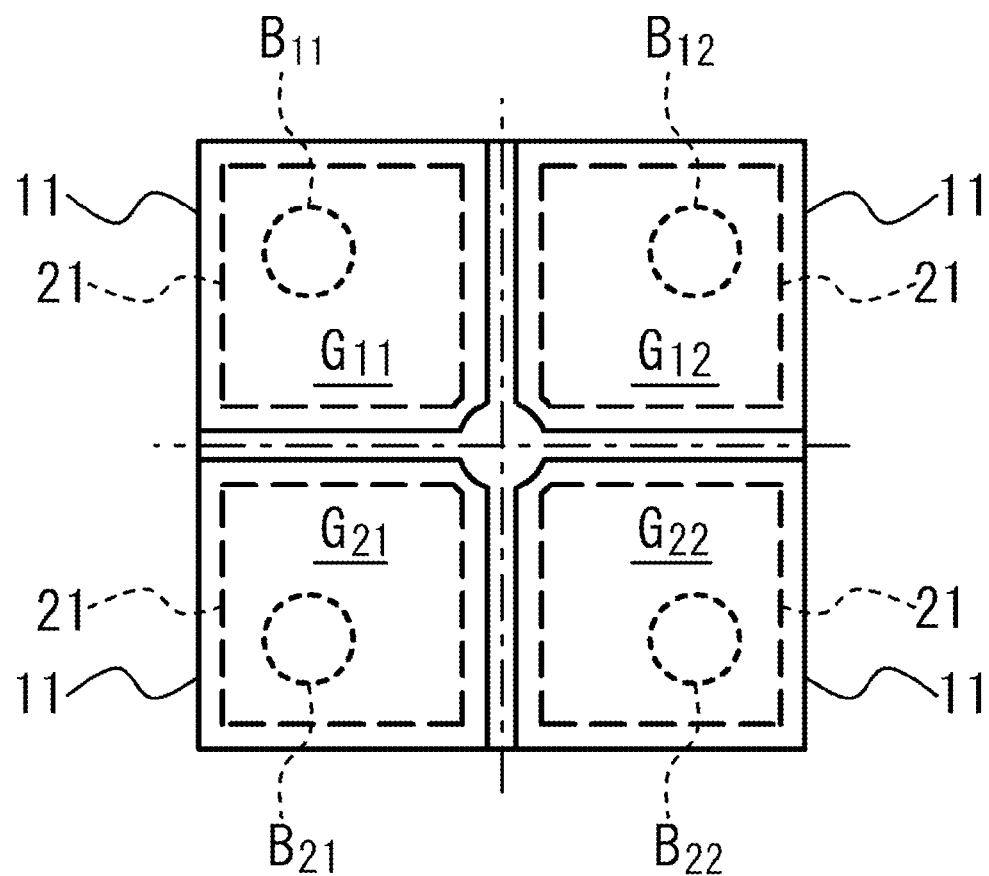
FIG. 5 is a plane view of upper absorption layers and upper contact layers illustrated in FIG. 3.

FIG. 5 is a plane view of the upper absorption layers 11 and the upper contact layers 21 illustrated in FIG. 3. Here, in FIG. 5, alternate long and short dash lines indicate boundaries between the pixels $G_{11}$, $G_{12}$, $G_{21}$ and $G_{22}$.

The upper absorption layers 11 and the upper contact layers 21 are provided for each of the pixels $G_{11}$, $G_{12}$, $G_{21}$ and $G_{22}$. That is to say, the upper absorption layers 11 and the upper contact layers 21 are electrically separated for each of the pixels $G_{11}$, $G_{12}$, $G_{21}$ and $G_{22}$. Therefore, in applying the bias voltage Vb, the absorption layers 11 generate the pixel signals $S_{11}$, $S_{12}$, $S_{21}$, and $S_{22}$ of the pixels $G_{11}$, $G_{12}$, $G_{21}$, and $G_{22}$, respectively. As illustrated by the dotted line of FIG. 4, the pixel signals $S_{11}$, $S_{12}$, $S_{21}$, and $S_{22}$ are taken out through the individual bumps $B_{11}$, $B_{12}$, $B_{21}$, and $B_{22}$, respectively.

Figure 6:
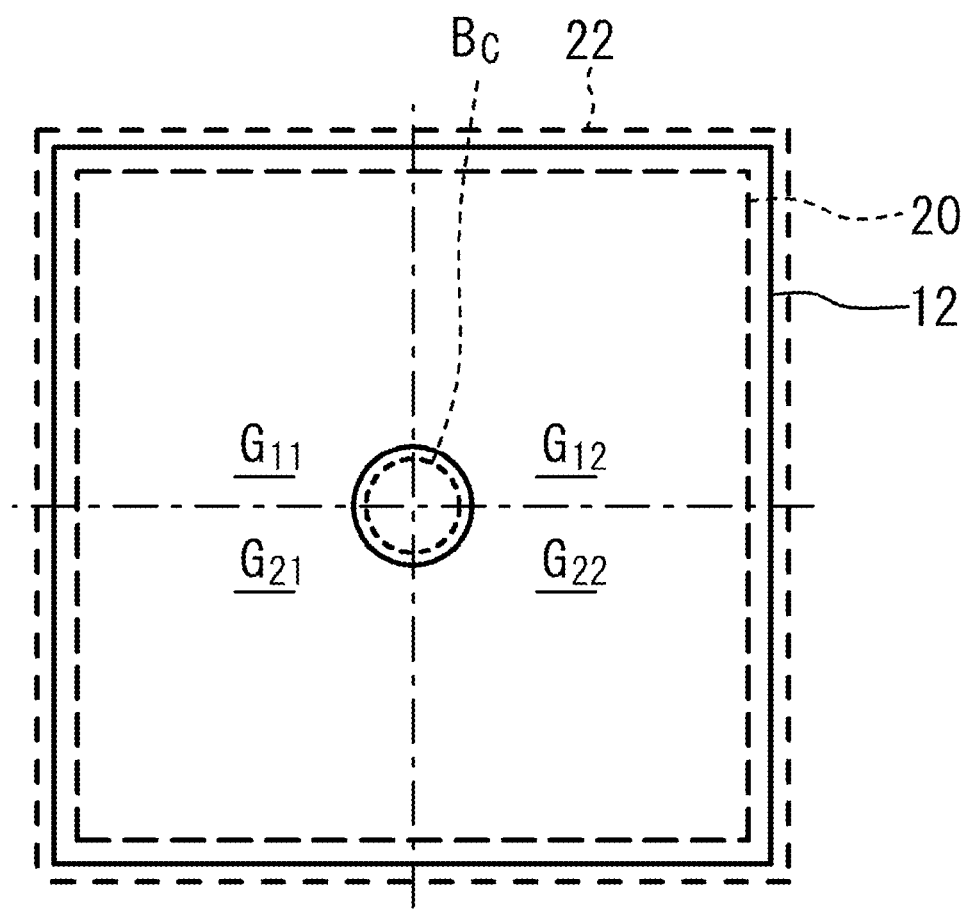
FIG. 6 is a plane view of a lower absorption layer, a middle contact layer, and a lower contact layer illustrated in FIG. 3.

Moreover, as illustrated in FIG. 4, the common bump $B_C$ is connected to the lower contact layer 22 via the metal film 62 and the leading wiring 52 formed so as to be extended in the lamination direction. FIG. 6 is a plane view of a lower absorption layer 12, a middle contact layer 20, and a lower contact layer 22 illustrated in FIG. 4. Here, in FIG. 5, alternate long and short dash lines indicate boundaries between the pixels $G_{11}$, $G_{12}$, $G_{21}$, and $G_{22}$.

Each of the lower absorption layer 12, the middle contact layer 20, and the lower contact layer 22 is common to the pixels $G_{11}$, $G_{12}$, $G_{21}$ and $G_{22}$. That is to say, each of the lower absorption layer 12, the middle contact layer 20, and the lower contact layer 22 has the same potential in the pixels $G_{11}$, $G_{12}$, $G_{21}$ and $G_{22}$. Therefore, in applying the bias voltage Vb, the lower absorption layer 12 generates a pixel signal $S_C$ common to the pixels $G_{11}$, $G_{12}$, $G_{21}$, and $G_{22}$. The pixel signal $S_C$ is taken out through the common bump $B_C$, as illustrated by the dotted line of FIG. 3.

Figure 7:
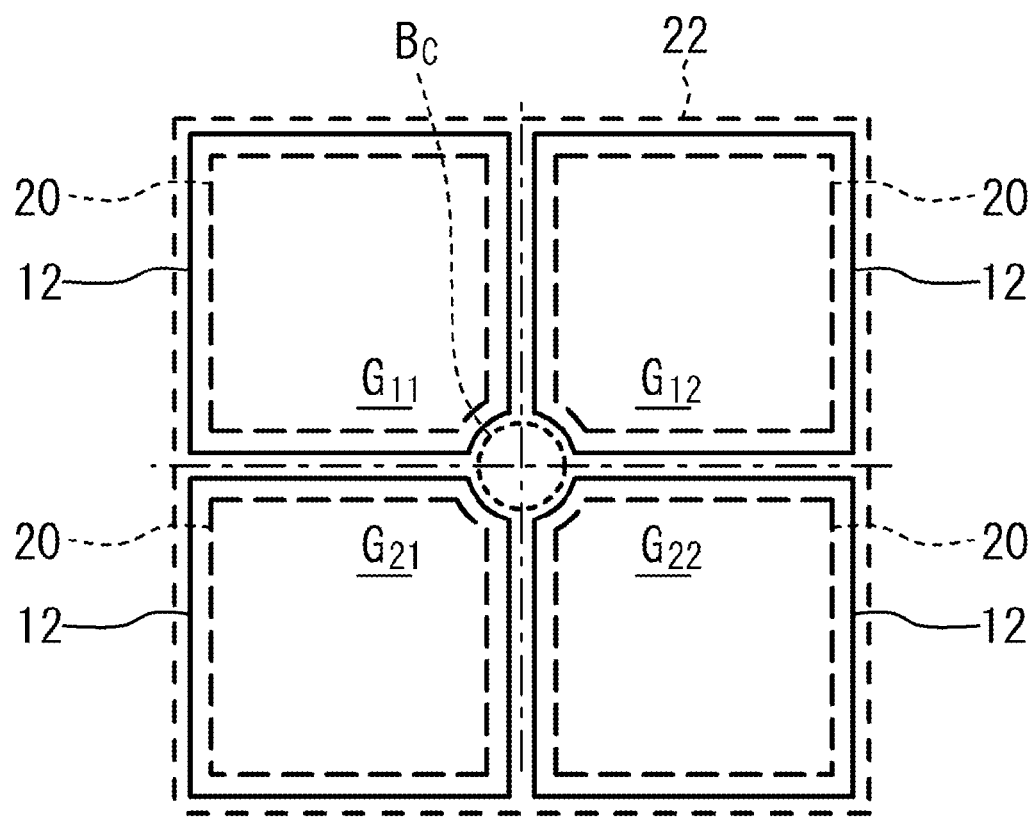
FIG. 7 is a plane view illustrating another example of the lower absorption layer, the middle contact layer, and the lower contact layer.

In an example of FIG. 6, since each of the lower absorption layer 12 and the middle contact layer 20 is common to the pixels $G_{11}$, $G_{12}$, $G_{21}$ and $G_{22}$, each of the surface wiring 50 and the metal film 60 may be common to the pixels $G_{11}$, $G_{12}$, $G_{21}$ and $G_{22}$, or may be separated in the pixels $G_{11}$, $G_{12}$, $G_{21}$ and $G_{22}$. Alternatively, as illustrated in FIG. 7, only the lower contact layer 22 is common, and each of the lower absorption layer 12 and the middle contact layer 20 may be provided for each of the pixels $G_{11}$, $G_{12}$, $G_{21}$ and $G_{22}$. In this case, each of the surface wiring 50 and the metal film 60 is provided for each of the pixels $G_{11}$, $G_{12}$, $G_{21}$ and $G_{22}$ in order to apply the bias voltage Vb to each lower absorption layer 12.

According to the imaging device of the present embodiment, the pixel signals $S_{11}$, $S_{12}$, $S_{21}$, and $S_{22}$ are generated for each of the pixels $G_{11}$, $G_{12}$, $G_{21}$ and $G_{22}$ by the upper absorption layers 11, and the pixel signal $S_C$ common to the pixels $G_{11}$, $G_{12}$, $G_{21}$, and $G_{22}$ is generated by the lower absorption layer 12. The pixel signals $S_{11}$, $S_{12}$, $S_{21}$ an $S_{22}$ are taken out by the individual bumps $B_{11}$, $B_{12}$, $B_{21}$, and $B_{22}$, respectively. The pixel signal $S_C$ is taken out by the single common bump $B_C$.

Therefore, since the common bump $B_C$ is provided for each pixel set U, the number of common bumps $B_C$ is reduced. Since in the present embodiment, the four pixels $G_{11}$, $G_{12}$, $G_{21}$ and $G_{22}$ are set to the single set U, the number of the common bumps $B_C$ becomes quarter, compared with a case where the common bump $B_C$ is provided for each of the pixels $G_{11}$, $G_{12}$, $G_{21}$ and $G_{22}$.

Since the individual bumps $B_{11}$, $B_{12}$, $B_{21}$, and $B_{22}$ which is the same number as the pixel signals $S_{11}$, $S_{12}$, $S_{21}$ and $S_{22}$ are provided, the respective pixel signals $S_{11}$, $S_{12}$, $S_{21}$ and $S_{22}$ are not detected by time division as disclosed in the above-mentioned Patent Document, and are detected at the same time. Therefore, according to the imaging device of the present embodiment, the sensitivity does not decrease.

In the present embodiment, the resolution of an image generated from the infrared ray which the lower absorption layer 12 absorbs is lower than that of an image generated from the infrared ray which the upper absorption layers 11 absorb because of the difference in the number of pixel signals. Therefore, processing which converts the pixel signal $S_C$ of the lower absorption layer 12 into the individual pixel signals respectively corresponding to the pixels $G_{11}$, $G_{12}$, $G_{21}$, and $G_{22}$ may be performed.

Figure 8:
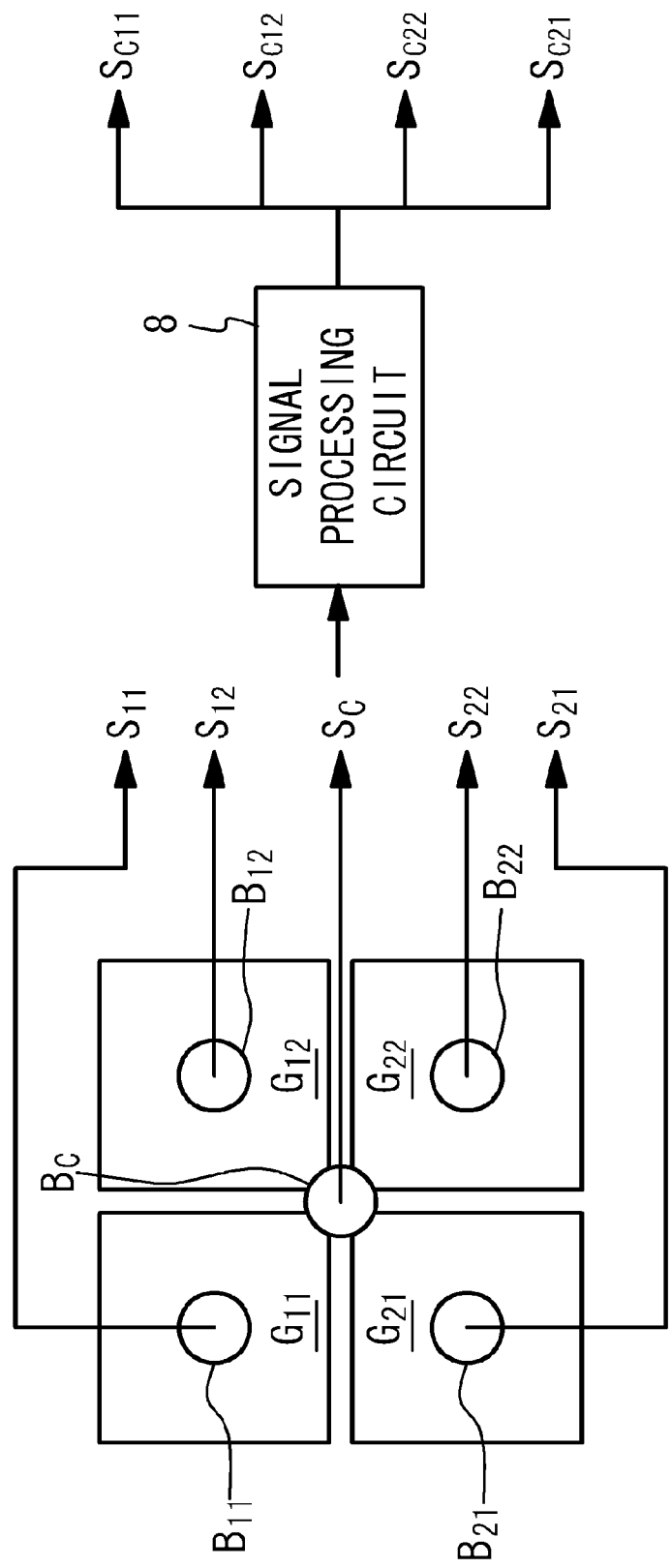
FIG. 8 is a diagram illustrating pixel signals taken out from the upper absorption layers and the lower absorption layer.

FIG. 8 is a diagram illustrating pixel signals $S_{11}$, $S_{12}$, $S_{21}$, $S_{22}$ and $S_C$ taken out from the upper absorption layers 11 and the lower absorption layer 12. Since the pixel signals $S_u$, $S_{12}$, $S_{21}$ and $S_{22}$ taken out from the individual bumps $B_{11}$, $B_{12}$, $B_{21}$, and $B_{22}$ are acquired separately for each of the pixels $G_{11}$, $G_{12}$, $G_{21}$ and $G_{22}$, the pixel signals $S_{11}$, $S_{12}$, $S_{21}$ and $S_{22}$ are directly used for formation processing of the image.

On the other hand, since the pixel signal $S_C$ taken out from the common bump $B_C$ is acquired common to the pixels $G_{11}$, $G_{12}$, $G_{21}$ and $G_{22}$, the pixel signal $S_C$ is converted into pixel signals $S_{C11}$, $S_{C12}$, $S_{C21}$ and $S_{C22}$ for each of the pixels $G_{11}$, $G_{12}$, $G_{21}$ and $G_{22}$ by a signal processing circuit 8. The signal processing circuit 8 is provided on a readout circuit substrate of the imaging device, for example. Here, detailed description of the signal processing circuit 8 is described later.

More specifically, the signal processing circuit 8 converts the pixel signal $S_C$ into the individual pixel signals $S_{C11}$, $S_{C12}$, $S_{C21}$ and $S_{C22}$ corresponding to the pixels $G_{11}$, $G_{12}$, $G_{21}$ and $G_{22}$, respectively, based on a ratio of each intensity of the pixel signals $S_{11}$, $S_{12}$, $S_{21}$ and $S_{22}$. That is, the intensities of the pixel signals $S_{C11}$, $S_{C12}$, $S_{C21}$ and $S_{C22}$ are acquired by the following formulas (1) to (4).

$$S_{C11}=S_C \cdot S_{11}/(S_{11}+S_{12}+S_{21}+S_{22}) \quad (1)$$

$$S_{C12}=S_C \cdot S_{12}/(S_{11}+S_{12}+S_{21}+S_{22}) \quad (2)$$

$$S_{C21}=S_C \cdot S_{21}/(S_{11}+S_{12}+S_{21}+S_{22}) \quad (3)$$

$$S_{C22}=S_C \cdot S_{22}/(S_{11}+S_{12}+S_{21}+S_{22}) \quad (4)$$

Thereby, the resolution of an image generated from the infrared ray which the lower absorption layer 12 absorbs can be improved. But, since the intensities of the pixel signal $S_{C11}$, $S_{C12}$, $S_{C21}$ and $S_{C22}$ are artificially calculated by the formulas (1) to (4) to some extent, the intensities are hard to be called highly precise values.

However, it is considered that it is sufficient to use such a pseudo calculation means as a pixel size becomes small. Hereinafter, the reason is explained.

The infrared ray generates a blur (what is called "a diffraction blur") by a diffraction phenomenon due to diffraction limit when the infrared ray forms an image on the surface of the infrared detection element. The light flux generated by the diffraction blur spreads in the form of a circle (what is called "a blur's circle"). The diameter $D_{diff}$ of the circle is acquires by the following formula (5).

$$D_{diff}=2.44\lambda F \qquad (5)$$

In the formula (5), "$\lambda$" is a wavelength of the light (i.e., the infrared ray), and "F" is an F number of an optical system. If it is assumed that the F number is 2, and the wavelength ranges of the infrared rays which the upper absorption layers 11 and the lower absorption layer 12 absorb are 5 μm (middle wavelength range) and 10 μm (long wavelength range), respectively, the diameters $D_{diff}$ of the respective wavelength ranges are calculated as 24.4 μm and 48.8 μm. Here, since a pixel size (i.e., a length of one side of the pixel) is reduced to about 20 μm by high resolution, for example, the diameter $D_{diff}$ of the long wavelength range exceeds the pixel size greatly, and the blur occurs in the image.

Therefore, the wavelength range of the infrared ray which the lower absorption layer 12 absorbs is set to a long wavelength side, compared with the wavelength range of the infrared ray which the upper absorption layers 11 absorb. Therefore, the intensities of the pixel signals $S_{C11}$, $S_{C12}$, $S_{C21}$ and $S_{C22}$ are calculated by the formulas (1) to (4) without causing a problem of accuracy. Here, without performing such calculation processing, the pixel signal $S_C$ taken out from the common bump $B_C$ may be directly used for the image formation processing. In this case, the image formation processing is performed under the conditions that the pixel of the infrared ray with the wavelength range absorbed by the lower absorption layer 12 is 4 times the pixel of the infrared ray with the wavelength range absorbed by the upper absorption layers 11. That is, the image formation processing is performed in consideration of a difference between the resolutions of the infrared rays with the respective wavelength ranges.

Figure 9:
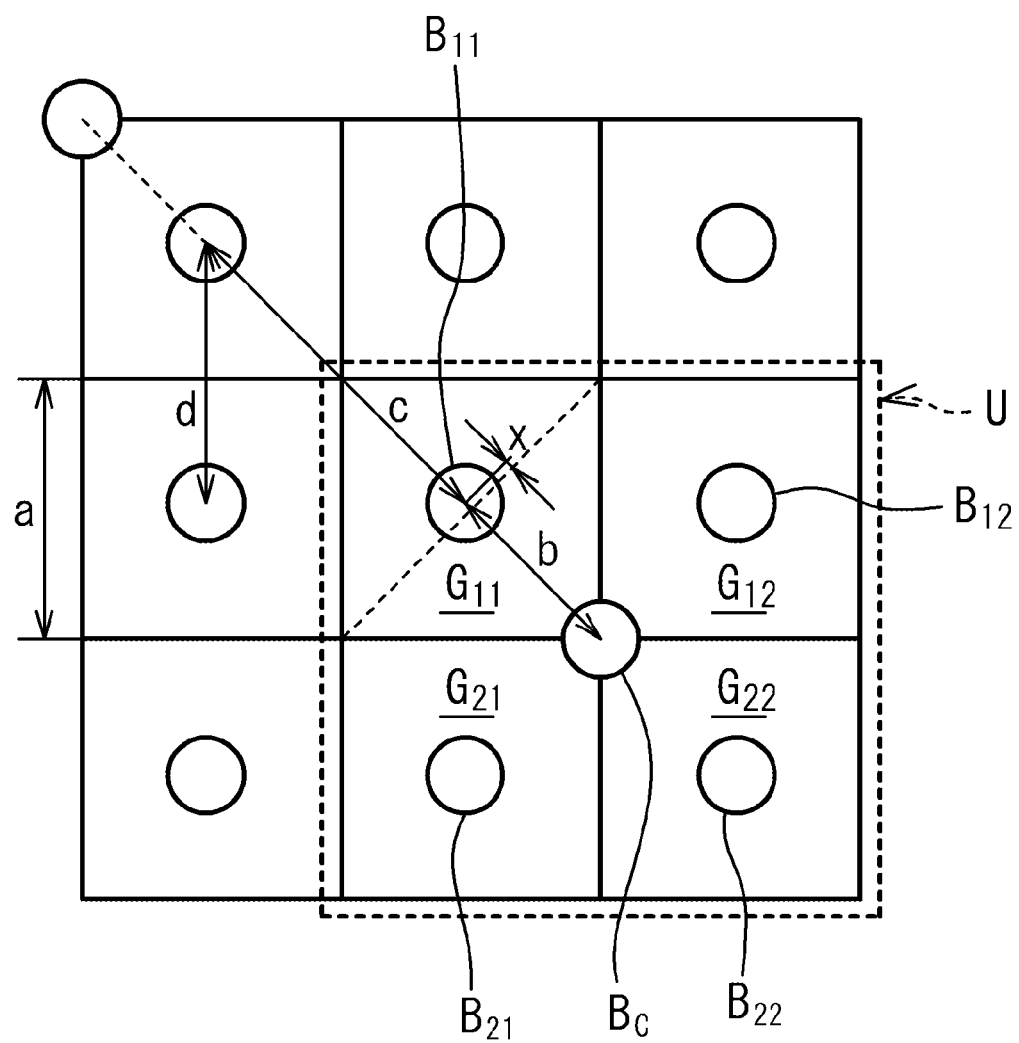
FIG. 9 is a diagram illustrating parameters about an interval between the bumps.

Next, a description will be given of the optimal arrangement of each of the bumps $B_{11}$, $B_{12}$, $B_{21}$ and $B_{22}$ in the above-mentioned embodiment. FIG. 9 is a diagram illustrating parameters about an interval between the bumps.

A parameter "a" indicates a length of one side of each of the square-shaped pixels $G_{11}$, $G_{12}$, $G_{21}$ and $G_{22}$. A parameter "b" indicates a distance between the centers of the common bump $B_C$ and the individual bumps $B_{11}$, $B_{12}$, $B_{21}$ and $B_{22}$ arranged at equal intervals around the common bump $B_C$. Here, the individual bumps $B_{11}$, $B_{12}$, $B_{21}$ and $B_{22}$ are arranged so as to become apexes of the square centering on the common bump $B_C$.

A parameter "c" indicates a distance between the centers of the individual bumps $B_{11}$, $B_{12}$, $B_{21}$ and $B_{22}$ between the pixel sets U adjacent to each other in an oblique direction (a direction of a diagonal line between the pixels). A parameter "d" indicates a distance between the centers of the individual bumps $B_{11}$, $B_{12}$, $B_{21}$ and $B_{22}$ between the pixel sets U adjacent to each other in a perpendicular direction or a horizontal direction. A parameter "x" indicates deviation between each of the center positions of the individual bumps $B_{11}$, $B_{12}$, $B_{21}$ and $B_{22}$, and the center of the pixel (i.e., an intersection of a diagonal line) in the oblique direction.

Figure 10:
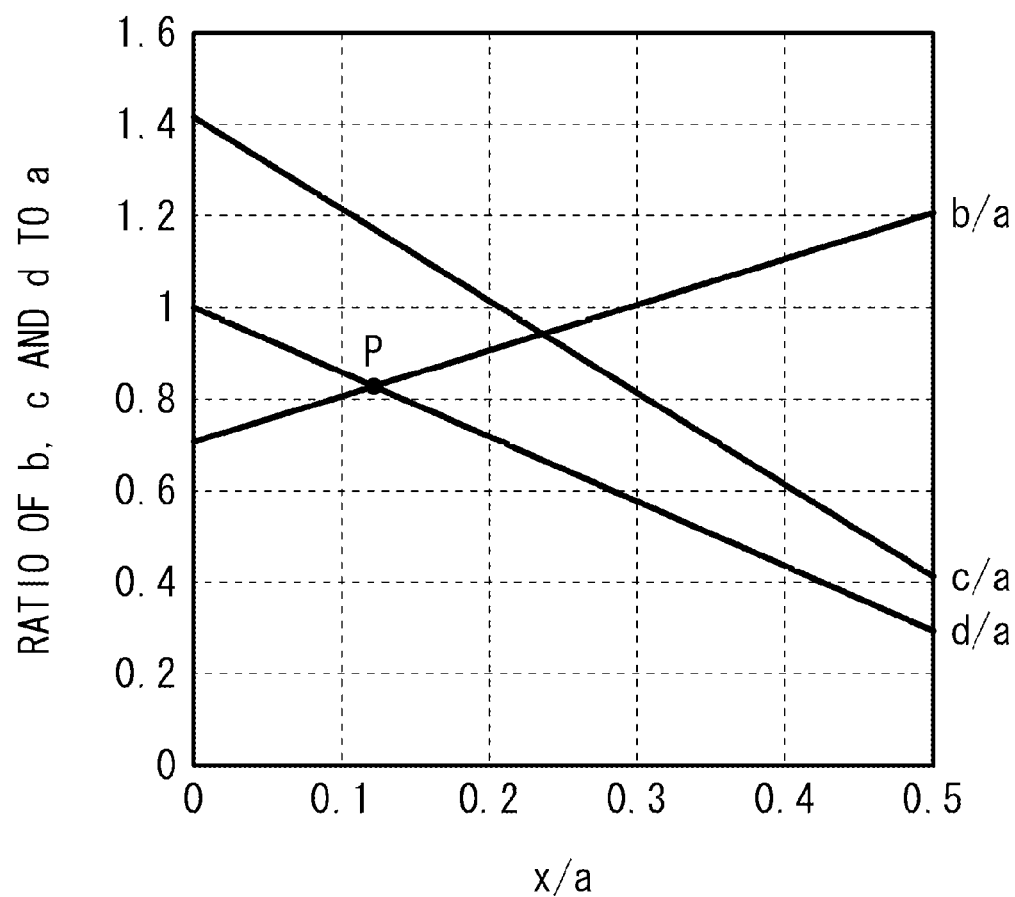
FIG. 10 is a graph illustrating the change of each distance between the bumps to deviation of the bumps.

FIG. 10 is a graph illustrating the change of each distance between the bumps to the deviation of the bumps. The horizontal axis of the graph indicates x/a, and the vertical axis of the graph indicates b/a, c/a and d/a. Each of changes of b/a, c/a and d/a to x/a is calculated based on FIG. 9.

As understood from FIG. 10, when a minimum value of the intervals between the bumps $B_{11}$, $B_{12}$, $B_{21}$, $B_{22}$ and $B_C$, i.e., a minimum value of b/a, c/a and d/a is maximized, x/a is a value (see a code "P") in which the distances "b" and "d" are the same as each other (i.e., "b" and "d"=0.83). That is, the distances "b" and "d" need to be set as 83% of the pixel size "a". When the pixel size "a" is 20 μm, for example, the distances "b", "c", "d" and "x" are 16.6 μm, 23.5 μm, 16.6 μm and 2.4 μm, respectively.

Figure 11:
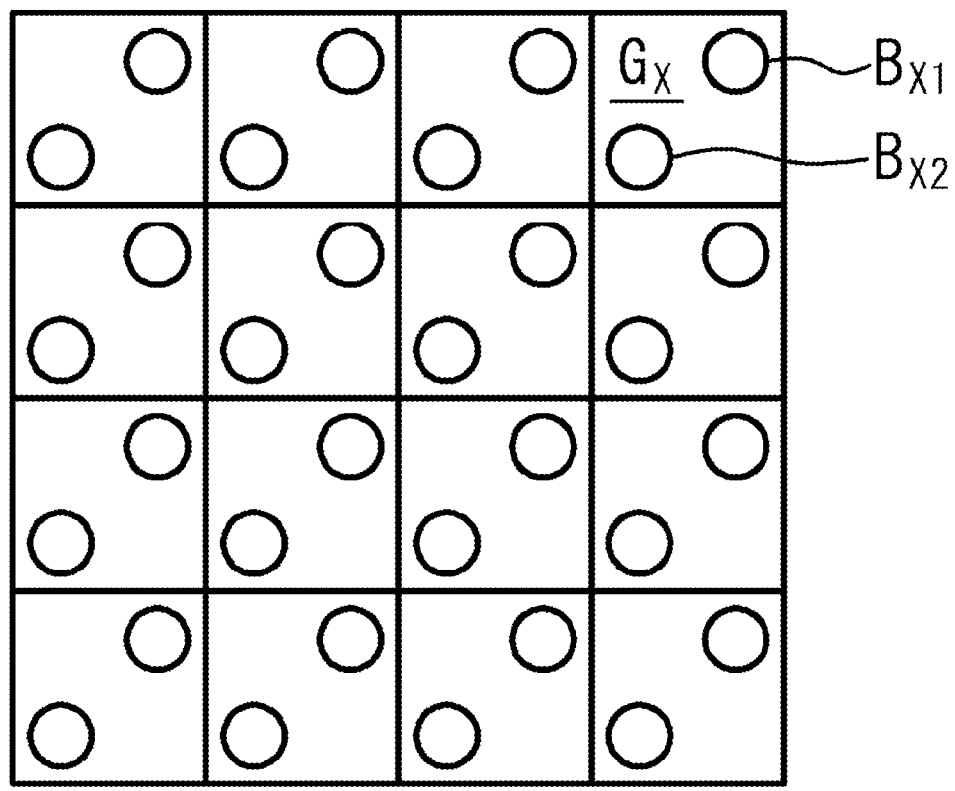
FIG. 11 is a plane view illustrating arrangement of bumps of an imaging device according to a comparative example.

FIG. 11 is a plane view illustrating arrangement of bumps of an imaging device according to a comparative example. This comparative example is an example of the configuration in which two bumps $B_{X1}$ and $B_{X2}$ are provided on one pixel $G_X$, as described in the above-mentioned non-Patent Document. The pixel $G_X$ is in the form of a square, as viewed from above. The bumps $B_{X1}$ and $B_{X2}$ are arranged so that distances from a center of the square are equal mutually on the diagonal line of the square.

A minimum value of the interval between the adjacent bumps $B_{X1}$ and $B_{X2}$ is calculated from FIG. 11, and becomes 70% of the pixel size (i.e., a length of one side of the square). On the contrary, the minimum value of the interval between the bumps according the present embodiment is 83% of the pixel size "a", as described above, and is only 13% larger than the minimum value of the comparative example.

When the minimum value of the intervals between the bumps $B_{11}$, $B_{12}$, $B_{21}$, $B_{22}$ and $B_C$ is 16.6 μm like the above-mentioned numerical example, and the diameter of each bump is 8 μm, a permissible amount of the deviation in the flip chip bonding (see FIG. 2) becomes 8.6 μm which is a difference between 16.6 μm and 8 μm. On the contrary, when the pixel size and the diameter of each bump in the comparative example illustrated in FIG. 11 are the same as those of the present embodiment, the minimum value of the interval between the adjacent bumps $B_{X1}$ and $B_{X2}$ is 14.1 μm, and hence the permissible amount of the deviation becomes 6.1 μm.

Therefore, the permissible amount of the deviation in the present embodiment increases only 40% to that of the comparative example. Accordingly, in the flip chip bonding, the contact between the bumps which are not the connection targets can be restrained effectively.

Next, a description will be given of manufacturing processes of the above-mentioned imaging device. FIGS. 12 to 17 are cross-section views illustrating the manufacturing process of the imaging device.

Figure 12:
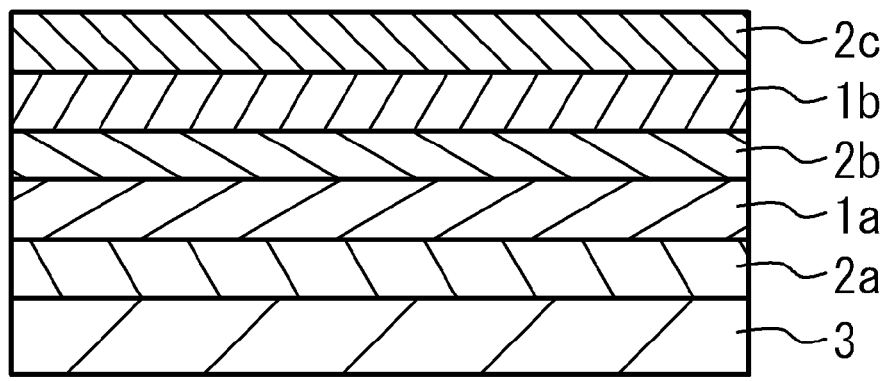
FIG. 12 is a cross-section view illustrating a manufacturing process of the imaging device.

First, a wafer equipped with laminated structure as illustrated in FIG. 12 is prepared. The laminated body is formed so that an n-type GaAs layer 2a, a MQW layer 1a, an n-type GaAs layer 2b, a MQW layer 1b, and an n-type GaAs layer 2c are laminated on the insulating substrate 3 in this order. The MQW layer 1a is sandwiched between the n-type GaAs layers 2a and 2b, and the MQW layer 1b is sandwiched between the n-type GaAs layers 2b and 2c. The MQW layers 1a and 1b differ in the material according to the wavelength range of the infrared ray having sensitivity. When the wavelength range of the MQW layer 1a is the middle wavelength range and the wavelength range of the MQW layer 1b is the long wavelength range, for example, the material of the MQW layer 1a is based on InGaAs (indium gallium arsenide) and the material of the MQW layer 1b is based on GaAs (gallium arsenide).

Figure 13:
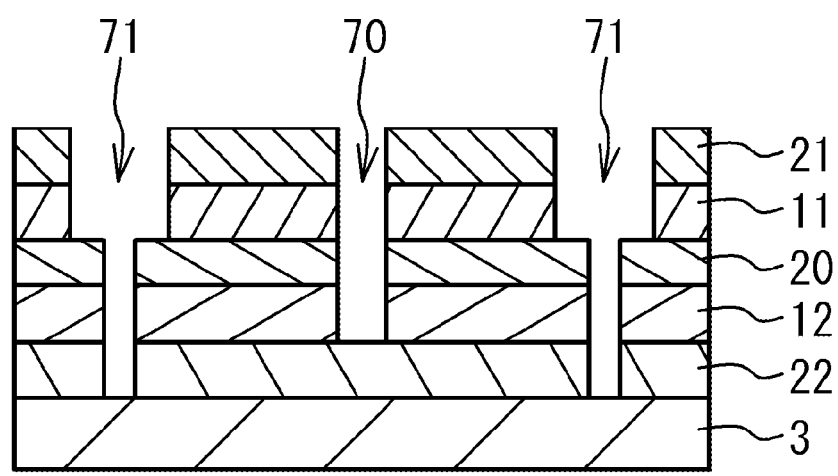
FIG. 13 is a cross-section view illustrating a manufacturing process of the imaging device.

Next, by dry etching, such as RIE (Reactive Ion Etching), a contact hole 70 and pixel separation grooves 71 are formed in the laminated body, as illustrated in FIG. 13. The contact hole 70 is formed near the center of the pixel set U so that each of the layers 1a, 1b, 2b and 2c except the lowermost n-type GaAs layer 2a is penetrated.

Each of the pixel separation grooves 71 is formed so that a plate surface of a sensor element substrate is divided for each pixel set U. The depth of each of the pixel separation grooves 71 is the same as the total of thicknesses of the respective layers 1a, 1b and 2a to 2c. In addition, the width of each of the pixel separation grooves 71 is wider in height sections of the MQW layer 1b and the n-type GaAs layer 2c than in other height sections.

By forming the contact hole 70 and the pixel separation grooves 71, the n-type GaAs layer 2a becomes the lower contact layer 22, and the MQW layer 1a becomes the lower absorption layer 12. Moreover, the n-type GaAs layer 2b becomes the middle contact layer 20, the MQW layer 1b becomes the upper absorption layers 11, and the n-type GaAs layer 2c becomes the upper contact layers 21.

Figure 14:
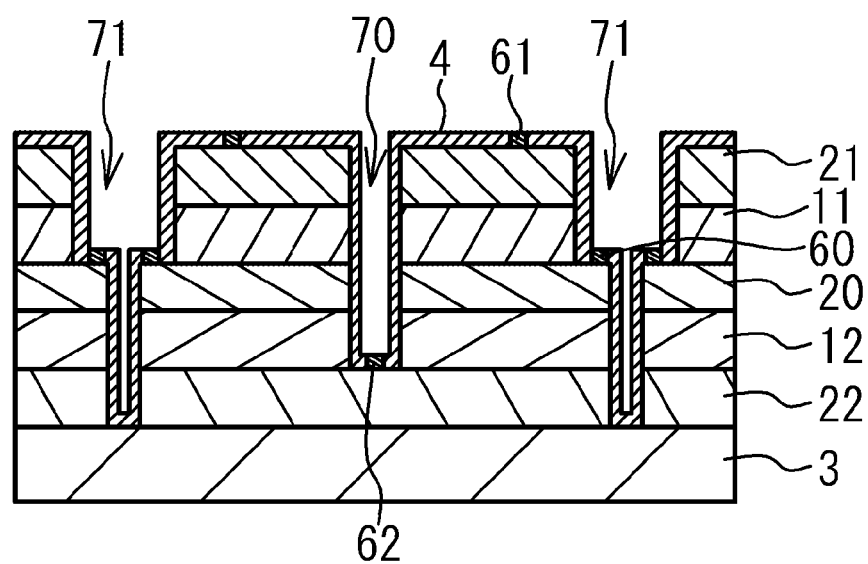
FIG. 14 is a cross-section view illustrating a manufacturing process of the imaging device.

Next, the insulating film 4 is formed so as to cover the surface of the whole laminated body, as illustrated in FIG. 14. The insulating film 4 is a passivation film, such as a silicon dioxide film. Holes are formed in the portions of the insulating film 4 by dry etching, such as the RIE, and the metal films 60 to 62 are formed on the holes. The insulating film 4 is formed by a thin-film formation means, such as a plasma CVD (Chemical Vapor Deposition) method, and the metal films 60 to 62 are formed by a thin-film formation means, such as lift-off. Here, the lift-off is a method in which a pattern is formed of a resist, a metal is deposited on the pattern, then the resist is removed, and hence the pattern with a metal film is formed on only portions having no resist.

Figure 15:
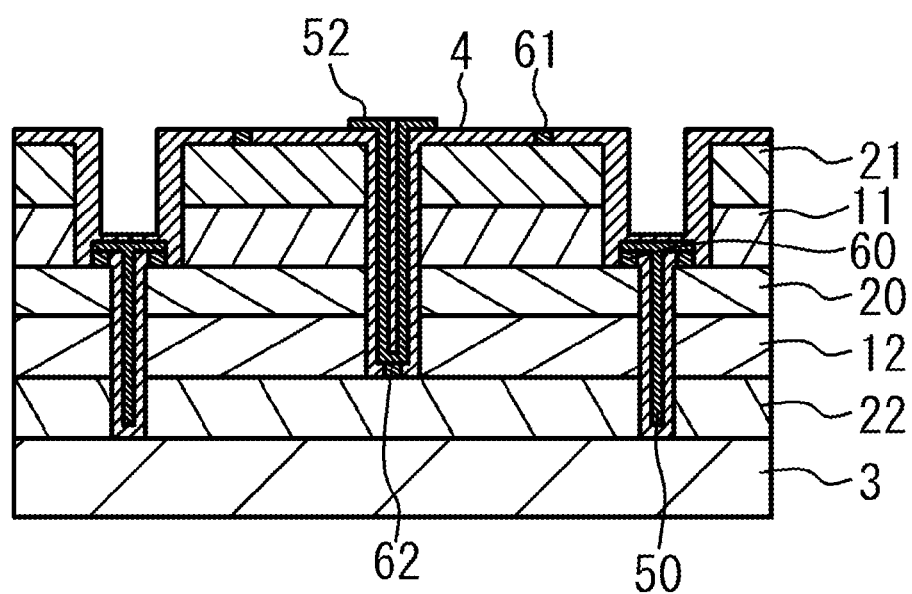
FIG. 15 is a cross-section view illustrating a manufacturing process of the imaging device.

Next, as illustrated in FIG. 15, a metallic thin film is formed by using spatter, for example, and then undesired portions are removed by a dry etching means, such as milling, so that the surface wiring 50 and the leading wiring 52 are formed. The leading wiring 52 is formed so as to be connected to the metal film 62 inside the contact hole 70, extend in the lamination direction, and spread on the top surface of the laminated body. Moreover, although the leading wiring 52 is annularly formed in a top view, the leading wiring 52 is not limited to this, but may be formed in other shape.

The surface wiring 50 is formed so as to bury each pixel separation groove 71, and is connected to the metal film 60 in an upper part of a step part of the middle contact layer 20. Moreover, in order to connect with an output portion of the bias voltage Vb, the surface wiring 50 is formed so as to extend to an outer circumferential portion of the sensor substrate.

Figure 16:
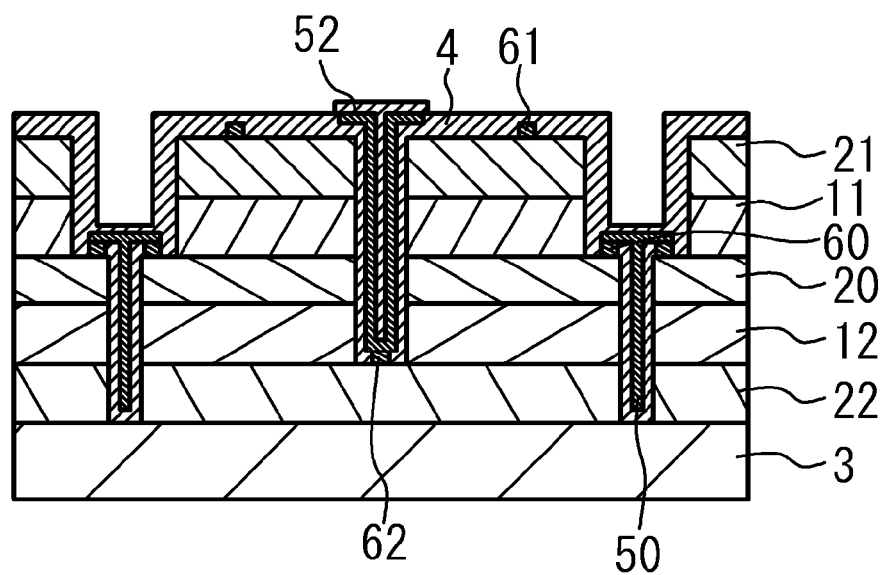
FIG. 16 is a cross-section view illustrating a manufacturing process of the imaging device.
Figure 17:
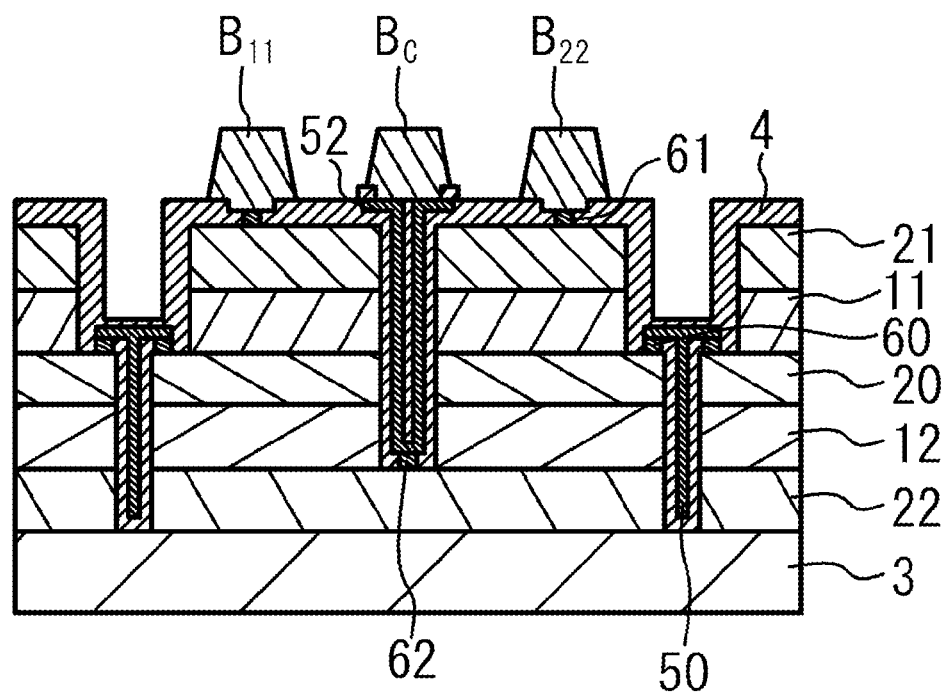
FIG. 17 is a cross-section view illustrating a manufacturing process of the imaging device.

Next, the film thickness of the insulating film 4 is made to increase using a plasma CVD method, for example, so that the surface wiring 50 and the leading wiring 52 are covered, as illustrated in FIG. 16.

Next, by using the dry etching, such as RIE, holes are formed on the insulating film 4 on the metal films 61 and 62 and the leading wiring 52, and the bumps $B_{11}$, $B_{12}$, $B_{21}$, $B_{22}$ and $B_C$ are formed in the holes. The bumps $B_{11}$, $B_{12}$, $B_{21}$, $B_{22}$ and $B_C$ are formed by the thin-film formation means, such as the lift-off, for example. Thus, the imaging device illustrated in FIG. 4 is manufactured.

Figure 18:
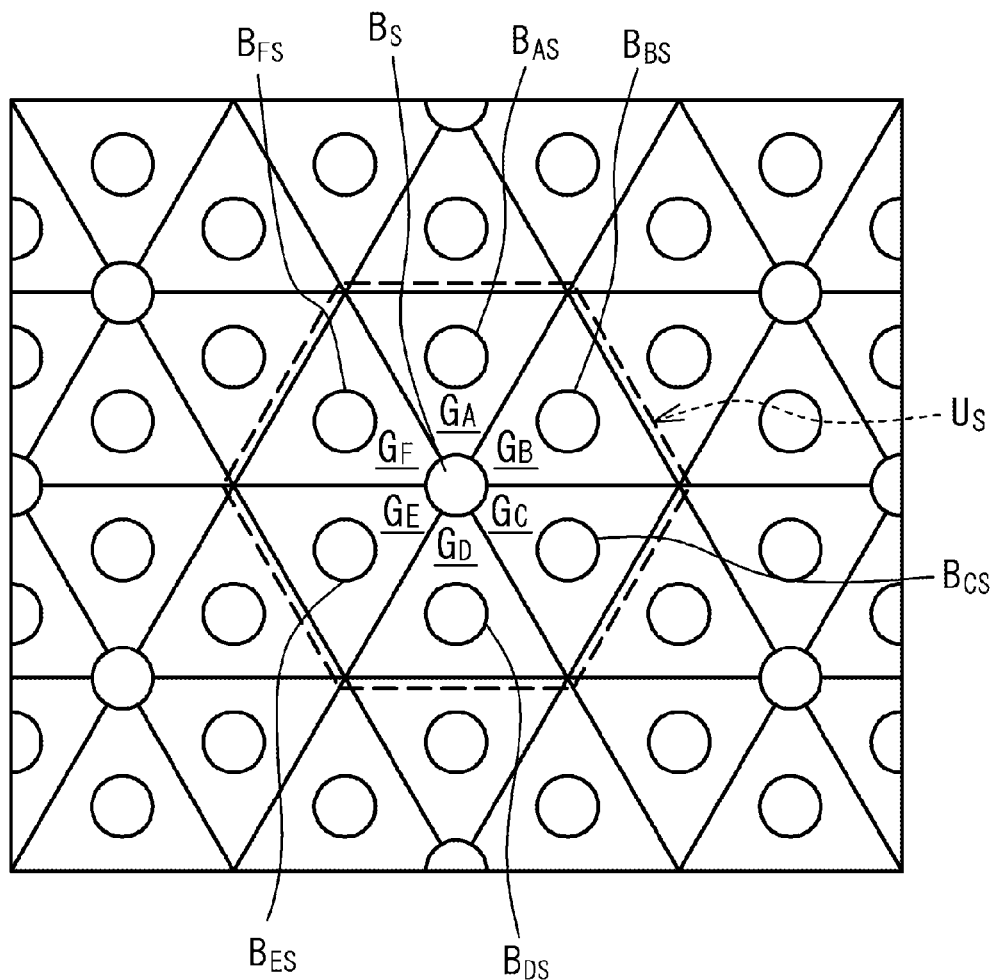
FIG. 18 is a plane view illustrating arrangement of bumps of the imaging device according to another embodiment.

In the above-mentioned embodiment, each of the pixels $G_{11}$, $G_{12}$, $G_{21}$ and $G_{22}$ has a square shape, but is not limited to this, and may have other shape. FIG. 18 is a plane view illustrating arrangement of bumps of the imaging device according to another embodiment.

In another embodiment, the pixel set $U_S$ includes six pixels $G_A$ to $G_F$ having the shape of an equilateral triangle, and has the shape of a regular hexagon as a whole. The common bump $B_S$ and the individual bump $B_{AS}$ to $B_{FS}$ have the shape of a circle in a top view. The common bump $B_S$ is provided at the center position of a pixel set $U_S$, and the individual bump $B_{AS}$ to $B_{FS}$ are provided at the center positions of regular triangles of the pixels $G_A$ to $G_F$, respectively. That is, the individual bump $B_{AS}$ to $B_{FS}$ are arranged at equal intervals around the common bump $B_S$. Here, the layer structure of this imaging device is the same as the layer structure illustrated in FIG. 4. Moreover, the manufacturing processes are also the same as the manufacturing processes illustrated in FIGS. 12 to 17.

Figure 19:
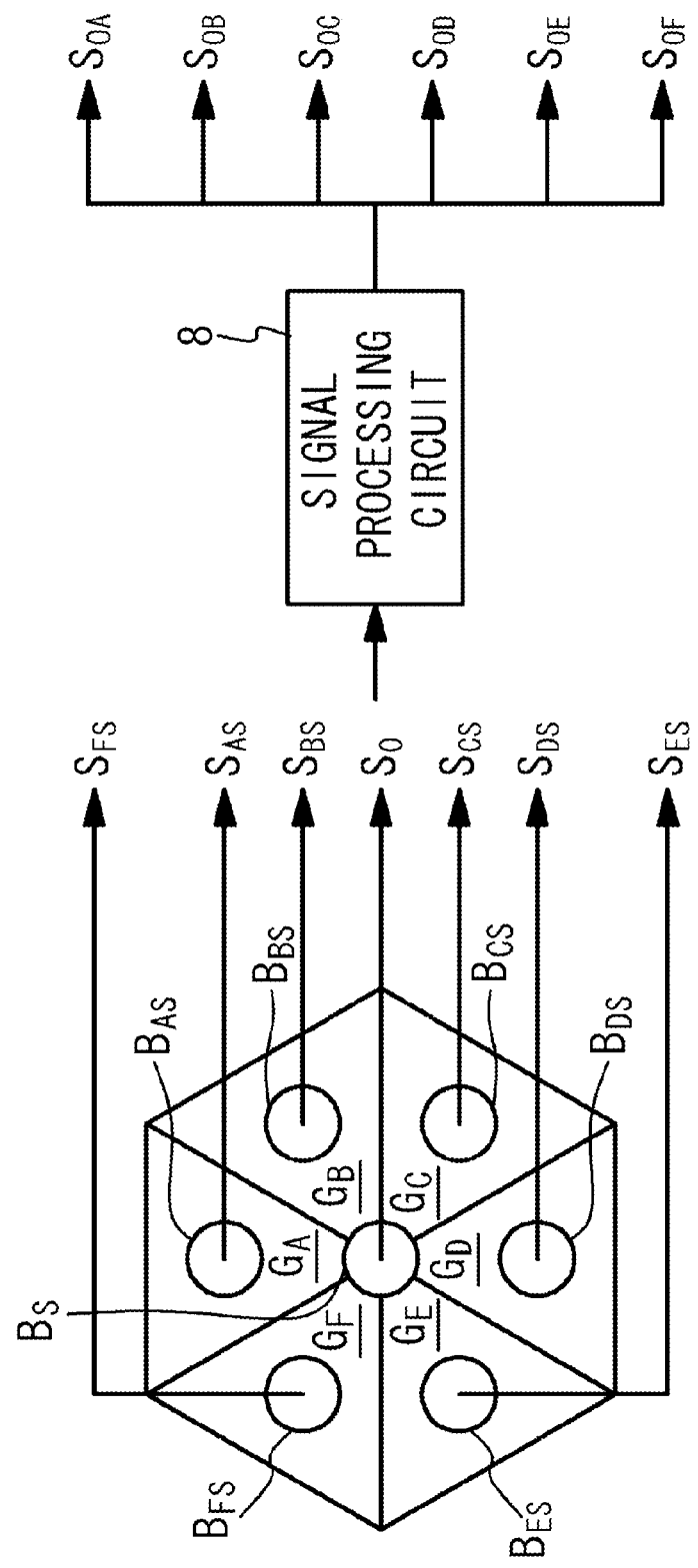
FIG. 19 is a diagram illustrating pixel signals taken out from the upper absorption layers and the lower absorption layer.

FIG. 19 is a diagram illustrating pixel signals taken out from the upper absorption layers 11 and the lower absorption layer 12. The six individual bump $B_{AS}$ to $B_{FS}$ are connected to the six upper absorption layers 11, respectively, and takes out the pixel signals $S_{AS}$ to $S_{FS}$ of the pixels $G_A$ to $G_F$ from the six upper absorption layers 11, respectively. The common bump BS is connected to the lower absorption layer 12, and takes out the pixel signal $S_O$ common to the pixels $G_A$ to $G_F$ from the lower absorption layer 12.

As with the previous embodiment, pixel signals $S_{AS}$ to $S_{FS}$ taken out from the individual bump $B_{AS}$ to $B_{FS}$ are directly used for the image formation processing. On the other hand, the pixel signal $S_O$ taken out from the common bump $B_S$ is converted into pixel signals $S_{OA}$ to $S_{OF}$ for the respective pixels $G_A$ to $G_F$ by the signal processing circuit 8, as illustrated in FIG. 19.

In this case, the signal processing circuit 8 converts the pixel signal $S_O$ into the individual pixel signals $S_{OA}$ to $S_{OF}$ corresponding to the respective pixels $G_A$ to $G_F$, based on a ratio of each intensity of the pixel signals $S_{AS}$ to $S_{FS}$ of the six pixels $G_A$ to $G_F$. The intensities of the pixel signals $S_{OA}$ to $S_{OF}$ are acquired from the following formulas (6) to (11).

$$S_{OA}=S_O \cdot S_{AS}/(S_{AS}+S_{BS}+S_{CS}+S_{DS}+S_{ES}+S_{FS}) \qquad (6)$$

$$S_{OB}=S_O \cdot S_{BS}/(S_{AS}+S_{BS}+S_{CS}+S_{DS}+S_{ES}+S_{FS}) \qquad (7)$$

$$S_{OC}=S_O \cdot S_{CS}/(S_{AS}+S_{BS}+S_{CS}+S_{DS}+S_{ES}+S_{FS}) \qquad (8)$$

$$S_{OD}=S_O \cdot S_{DS}/(S_{AS}+S_{BS}+S_{CS}+S_{DS}+S_{ES}+S_{FS}) \qquad (9)$$

$$S_{OE}=S_O \cdot S_{ES}/(S_{AS}+S_{BS}+S_{CS}+S_{DS}+S_{ES}+S_{FS}) \qquad (10)$$

$$S_{OF}=S_O \cdot S_{FS}/(S_{AS}+S_{BS}+S_{CS}+S_{DS}+S_{ES}+S_{FS}) \qquad (11)$$

Thereby, the resolution of the image generated from the infrared ray which the lower absorption layer 12 absorbs can be improved, as with the previous embodiment. But, since the intensities of the pixel signals $S_{OA}$ to $S_{OF}$ are artificially calculated by the formulas (6) to (11) to some extent, the intensities are hard to be called highly precise values in the another embodiment.

However, also in the another embodiment, it is considered that it is sufficient to use such a pseudo calculation means as the pixel size becomes small, as stated using the above-mentioned formula (5). When a length of one side of the regular triangles of the respective pixels $G_A$ to $G_F$ is 25 µm, for example, an area of each of the pixels $G_A$ to $G_F$ is 271 µm$^2$, and an area of the pixel set $U_S$ is 1624 µm$^2$.

On the other hand, as described above, the diameters $D_{diff}$ of the blur's circles of the middle wavelength range and the long wavelength range are calculated as 24.4 µm and 48.8 µm from the formula (5), respectively. Therefore, an area of the blur's circle of the long wavelength range is 1869 µm$^2$, and is larger than the area of the pixel set $U_S$.

Therefore, the wavelength range of the infrared ray which the lower absorption layer 12 absorbs is set to a long wavelength side, compared with the wavelength range of the infrared ray which the upper absorption layers 11 absorb. Therefore, the intensities of the pixel signals $S_{OA}$ to $S_{OF}$ are calculated by the formulas (6) to (11) without causing a problem of accuracy. Here, without performing such calculation processing, the pixel signal $S_O$ taken out from the common bump $B_O$ may be directly used for the image formation processing. In this case, the image formation processing is performed under the conditions that the pixel of the infrared ray with the wavelength range absorbed by the lower absorption layer 12 is 6 times the pixel of the infrared ray with the wavelength range absorbed by the upper absorption layers 11. That is, the image formation processing is performed in consideration of a difference between the resolutions of the infrared rays with the respective wavelength ranges.

In the another embodiment, the individual bumps $B_{AS}$ to $B_{FS}$ are arranged at the center positions of regular triangles of the pixels $G_A$ to $G_F$, as understood from FIG. 18, so that the minimum value of intervals between the bumps is maximized. When the length of one side of the regular triangles of the pixels $G_A$ to $G_F$ is 25 µm, for example, the minimum value of intervals between the bumps is 14.4 µm. Therefore, when the diameter of each bump is 8 µm, for example, the permissible amount of the deviation in the flip chip bonding (see FIG. 2) becomes 6.4 µm which is a difference between 14.4 µm and 8 µm.

Figure 20:
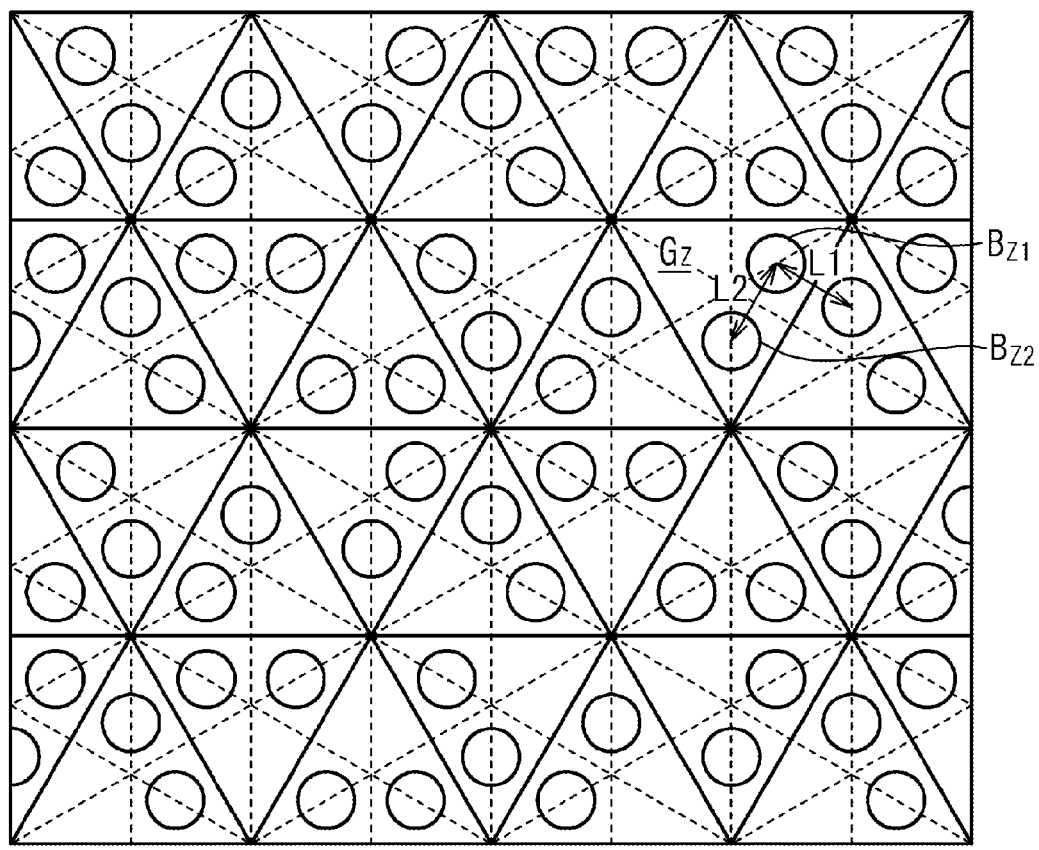
FIG. 20 is a plane view illustrating arrangement of bumps of the imaging device according to the comparative example.

On the other hand, FIG. 20 is a plane view illustrating arrangement of the bumps of the imaging device according to the comparative example. In the comparative example, the regular triangle-shaped pixels $G_Z$ are arranged vertically and horizontally, and two bumps $B_{Z1}$ and $B_{Z2}$ are provided for each pixel $G_Z$. Each of the bumps $B_{Z1}$ and $B_{Z2}$ has the shape of a circle in a top view, and is arranged on a centroidal line of the regular triangle of the pixel $G_Z$ (see each dotted line). Here, a distance L1 between the bumps $B_{Z1}$ of the adjacent pixels $G_Z$ is equal to a distance L2 between the bumps $B_{Z1}$ and $B_{Z2}$ in the same pixel $G_Z$.

In the comparative example, when the length of one side of the regular triangle of each pixel $G_Z$ is 25 µm, the minimum value of intervals between the bumps is 9.2 µm. Therefore, when the diameter of each bump is 8 µm, for example, the permissible amount of the deviation in the flip chip bonding (see FIG. 2) becomes 1.2 µm which is a difference between 9.2 µm and 8 µm. According to the imaging device of the another embodiment, the permissible amount of the deviation can be made into 5 or more times of the comparative example.

Figure 21:
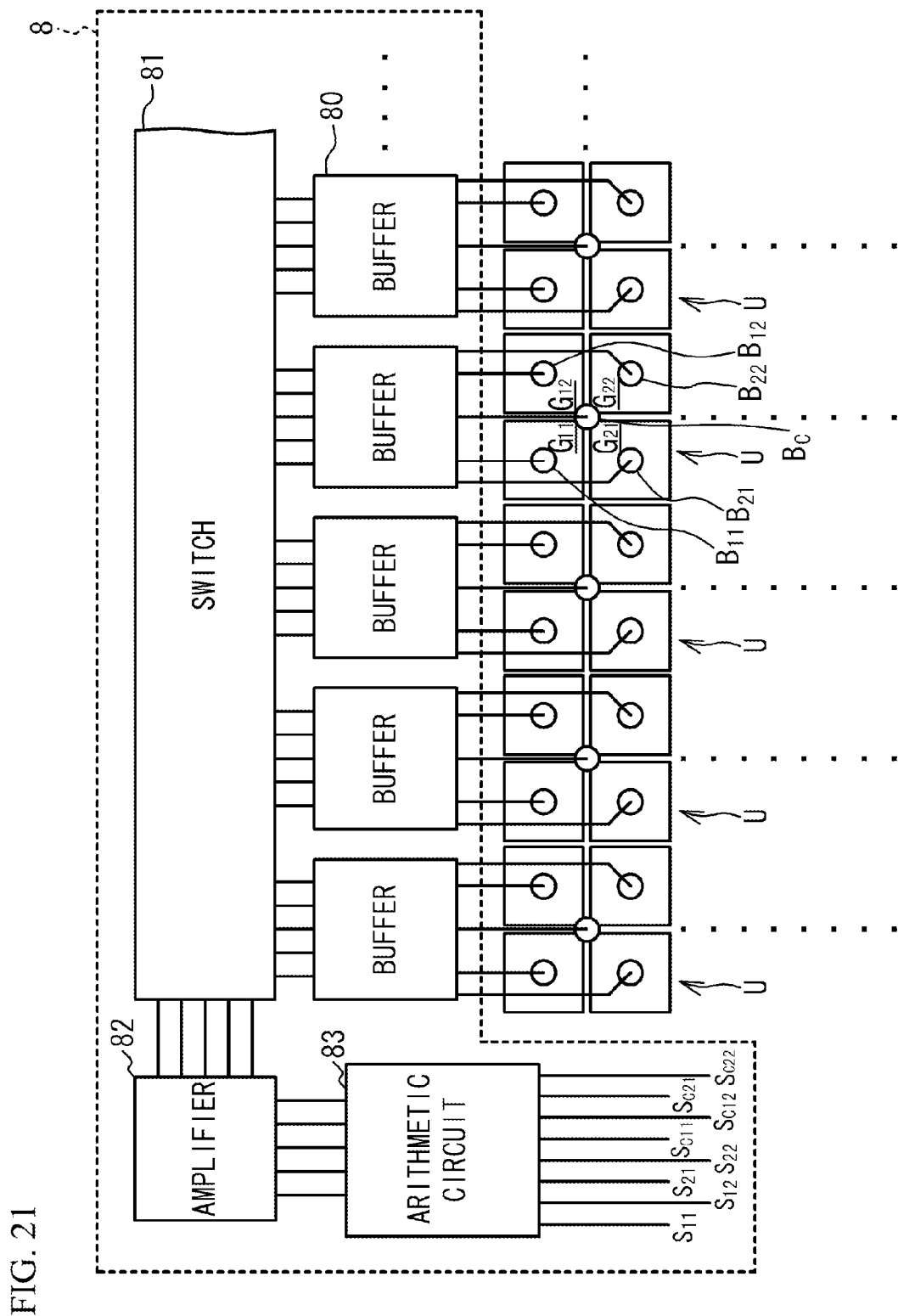
FIG. 21 is a block diagram illustrating an example of functional configuration of a signal processing circuit.

FIG. 21 is a block diagram illustrating an example of functional configuration of the signal processing circuit 8. Here, in FIG. 21, the embodiment illustrated in FIGS. 3 to 8 is indicated as the pixel set U.

The signal processing circuit 8 includes a plurality of buffers 80, a switch 81, an amplifier 82, and an arithmetic circuit 83. Each of the buffers 80 is provided for each pixel set U, and is connected to the individual bumps $B_{11}$, $B_{12}$, $B_{21}$ and $B_{22}$ and the common $B_C$ in the pixel set. The pixel signals $S_{11}$, $S_{12}$, $S_{21}$ and $S_{22}$ are inputted to the buffer 80 via the individual bumps $B_{11}$, $B_{12}$, $B_{21}$ and $B_{22}$, respectively, and the pixel signal $S_C$ is inputted to the buffer 80 via the common bump $B_C$. The buffer 80 accumulates temporarily the respective pixel signals $S_{C11}$, $S_{C12}$, $S_{C21}$, $S_{C22}$ and $S_C$.

The switch 81 selects a set U which is a readout object of the pixel signals $S_{C11}$, $S_{C12}$, $S_{C21}$, $S_{C22}$ and $S_C$, from the plurality of sets U. The selection is performed sequentially by time division, and an order of the selection is not limited. The pixel signals $S_{C11}$, $S_{C12}$, $S_{C21}$, $S_{C22}$ and $S_C$ of the selected pixel set U are inputted from the buffer 80 to the amplifier 82 via the switch 81. The amplifier 82 amplifies the pixel signals $S_{C11}$, $S_{C12}$, $S_{C21}$, $S_{C22}$ and $S_C$.

The arithmetic circuit 83 performs processing denoted by the above-mentioned formulas (1) to (4), as stated with reference to FIG. 8. That is, the arithmetic circuit 83 converts the pixel signal $S_C$ into the individual pixel signals $S_{C11}$, $S_{C12}$, $S_{C21}$ and $S_{C22}$ corresponding to the respective pixels $G_{11}$, $G_{12}$, $G_{21}$ and $G_{22}$, based on a ratio of each intensity of the pixel signals $S_{11}$, $S_{12}$, $S_{21}$ and $S_{22}$ of the pixels. Here, in the case of the embodiment illustrated in FIG. 18, the arithmetic circuit 83 performs processing denoted by the above-mentioned formulas (6) to (11), as stated with reference to FIG. 19.

As described above, the imaging device according to the embodiment includes the plurality of upper absorption layers 11, the lower absorption layer 12, the plurality of individual bumps $B_{11}$, $B_{12}$, $B_{21}$ and $B_{22}$, and the common bump $B_C$. The upper absorption layers 11 absorb the infrared ray with a given wavelength range, and generates the pixel signals $S_{11}$, $S_{12}$, $S_{21}$ and $S_{22}$ of the pixels $G_{11}$, $G_{12}$, $G_{21}$ and $G_{22}$, respectively. The lower absorption layer 12 absorbs the infrared ray with the wavelength range which is different from the wavelength range of the absorption layers 11, and generates the pixel signal $S_C$ common to the pixels $G_{11}$, $G_{12}$, $G_{21}$ and $G_{22}$. The individual bumps $B_{11}$, $B_{12}$, $B_{21}$ and $B_{22}$ take out the pixel signals $S_{11}$, $S_{12}$, $S_{21}$ and $S_{22}$ from the upper absorption layers 11, respectively. The common bump $B_C$ takes out the pixel signal $S_C$ from the lower absorption layer 12.

According to the imaging device of the present embodiment, the pixel signals $S_{11}$, $S_{12}$, $S_{21}$ and $S_{22}$ are generated from the pixels $G_{11}$, $G_{12}$, $G_{21}$ and $G_{22}$ by the upper absorption layers 11, respectively, and the pixel signal $S_C$ common to the pixels $G_{11}$, $G_{12}$, $G_{21}$ and $G_{22}$ is generated by the lower absorption layer 12. The pixel signals $S_{11}$, $S_{12}$, $S_{21}$ and $S_{22}$ are taken out by the individual bumps $B_{11}$, $B_{12}$, $B_{21}$ and $B_{22}$, respectively, and the pixel signal $S_C$ is taken out by a single common bump $B_C$.

Therefore, the single common bump $B_C$ may be provided for the pixels $G_{11}$, $G_{12}$, $G_{21}$ and $G_{22}$ (i.e., the pixel set U), and hence the number of common bumps $B_C$ is reduced.

Since the individual bumps $B_{11}$, $B_{12}$, $B_{21}$, and $B_{22}$ which is the same number as the pixel signals $S_{11}$, $S_{12}$, $S_{21}$ and $S_{22}$ are provided, the respective pixel signals $S_{11}$, $S_{12}$, $S_{21}$ and $S_{22}$ are not detected by time division as disclosed in the above-mentioned Patent Document, and are detected at the same time. Therefore, according to the imaging device of the present embodiment, the sensitivity does not decrease, and the interval between the bumps (i.e., electrodes) can be extended effectively.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various change, substitutions, and alterations could be made hereto without departing from the spirit and scope of the invention.

What is claimed is:
1. An imaging device, comprising:
a plurality of first absorption layers that absorbs an infrared ray with a given wavelength range, and generates pixel signals of a plurality of pixels, respectively;

at least one second absorption layer that underlies the plurality of first absorption layers, and absorbs an infrared ray with a wavelength range which is different from the given wavelength range of the plurality of first absorption layers, and generates a pixel signal common to the pixels;

a plurality of first electrodes that takes out the pixel signals from first absorption layers in the plurality of first absorption layers, respectively; and a second electrode that takes out the pixel signal from the at least one second absorption layer;

a plurality of upper contact layers that lies over the plurality of first absorption layers, respectively, and connects the plurality of first absorption layers and the plurality of first electrodes;

at least one middle layer that lies between the plurality of first absorption layers and the at least one second absorption layer, and has voltage applied from an exterior;

a lower contact layer that underlies the at least one second absorption layer, and is connected to the second electrode via a wiring extended in a lamination direction.

2. The imaging device as claimed in claim 1, further comprising a signal processing circuit that converts the pixel signal taken out from the at least one second absorption layer via the second electrode into individual pixel signals corresponding to the pixels, respectively, based on a ratio of each intensity of the pixel signals of the pixels taken out from the first absorption layers via the first electrodes, respectively.

3. The imaging device as claimed in claim 1, wherein the wavelength range of the infrared ray which the at least one second absorption layer is set to absorb is longer than the given wavelength range of the first absorption layers.

4. The imaging device as claimed in claim 1, wherein the first electrodes are arranged at equal intervals around the second electrode.

5. The imaging device as claimed in claim 1, wherein the first electrodes and the second electrode are formed of indium.

6. The imaging device according to claim 1, wherein the first absorption layers are electrically separated from each other.

* * * * *